(12) United States Patent
Chen (10) Patent No.: US 11,375,630 B1
(45) Date of Patent: Jun. 28, 2022

(54) POWER DISTRIBUTOR PROTECTION

(71) Applicant: Liang Light Chen, Los Gatos, CA (US)

(72) Inventor: Liang Light Chen, Los Gatos, CA (US)

( * ) Notice: Subject to any disclaimer, the term of this patent is extended or adjusted under 35 U.S.C. 154(b) by 0 days.

(21) Appl. No.: 17/208,085

(22) Filed: Mar. 22, 2021

(51) Int. Cl.
| | |
|---|---|
| *H05K 5/02* | (2006.01) |
| *H02B 1/26* | (2006.01) |
| *H01R 13/447* | (2006.01) |
| *H05K 5/03* | (2006.01) |
| *H01R 25/00* | (2006.01) |
| *H02B 1/04* | (2006.01) |

(52) U.S. Cl.
CPC ......... *H05K 5/0221* (2013.01); *H01R 13/447* (2013.01); *H01R 25/006* (2013.01); *H02B 1/04* (2013.01); *H02B 1/26* (2013.01); *H05K 5/03* (2013.01)

(58) Field of Classification Search
CPC ............ H02G 3/08; H02G 3/081; H05K 5/00; H05K 5/02; H05K 5/03; H05K 5/0217; H05K 5/0247; H01R 25/006; H01R 13/447; H01R 13/453; H01R 13/46; H02B 1/26; H02B 1/04; H02B 1/30; H02B 1/14; H02B 1/38
USPC ......... 174/50, 520, 535, 559, 53, 54, 66, 67; 361/622, 600, 601, 644, 641, 654, 669, 361/672, 679.01, 724, 728, 823; 220/3.3, 220/241, 242
See application file for complete search history.

(56) References Cited

U.S. PATENT DOCUMENTS

| | | | | | |
|---|---|---|---|---|---|
| 4,785,376 | A | * | 11/1988 | Dively | H02B 1/50 174/38 |
| 4,901,202 | A | * | 2/1990 | Leschinger | H02G 15/076 361/829 |
| 5,092,787 | A | * | 3/1992 | Wise | H02G 3/288 439/211 |
| 8,321,163 | B2 | * | 11/2012 | Ewing | H02B 1/011 702/60 |
| 9,800,031 | B2 | * | 10/2017 | Irons | H02G 3/08 |
| 10,181,704 | B2 | * | 1/2019 | Stevens | H02B 1/20 |
| 10,476,218 | B1 | * | 11/2019 | Chen | H01R 25/006 |

* cited by examiner

*Primary Examiner* — Angel R Estrada
(74) *Attorney, Agent, or Firm* — Douglas L. Weller (57) ABSTRACT

A power distributor includes a plurality of power outlets and a plurality of power inlet receptors. Each power inlet receptor is configured to supply power to all the power outlets in the plurality of power outlets. Each power outlet has a cover that when in a closed and locked configuration prevents physical access to a power inlet receptor. A physical locking mechanism is configured to lock every cover from the plurality of covers. The physical locking mechanism allows at most one cover from the plurality of covers to be unlocked at a time so that the physical locking mechanism prevents the simultaneous unlocking of more than one cover from the plurality of covers.

7 Claims, 10 Drawing Sheets

POWER DISTRIBUTOR PROTECTION

BACKGROUND

Independent power supply equipment of multiple outlets or device power distributors are widely used in the real world. A power distributor is a block of electrical sockets that is also variously referred to as a power strip, an extension block, a power board, a power bar, a plug board, a trailer lead and by other names. Sometimes it is easiest to supply power to a power distributor one location of a power distributor. Other times it is more convenient to supply power at another location of the power distributor. However, supplying power at more than one location of a power distributor can be hazardous.

DESCRIPTION OF THE EMBODIMENTS

As described below a power distributor includes a plurality of power outlets and a plurality of power inlet receptors. Each power inlet receptor is configured to supply power to all the power outlets in the plurality of power outlets. Each power outlet has a cover that when in a closed and locked configuration prevents physical access to a power inlet receptor. A physical locking mechanism is configured to lock every cover from the plurality of covers. The physical locking mechanism allows at most one cover from the plurality of covers to be unlocked at a time so that the physical locking mechanism prevents the simultaneous unlocking of more than one cover from the plurality of covers.

For example, the physical locking mechanism includes a lock for each cover and only a single key for all the locks. Each lock is configured so that the single key can be used to unlock the lock to allow its cover to be unlocked and placed in an open position so that one power inlet receptor is available to be used to provide power to the plurality of power outlets, wherein the lock holds the single key and does not release the single key for removal until the lock is locked, so that the single key cannot be used to simultaneously unlock more than one lock from the plurality of locks. Each cover can include a key receptor for holding the single key.

Alternatively, each cover has a switch. Each switch is configured so that the switch can be placed in an unlock position to allow its cover to be placed in an open position so that one power inlet receptor from the plurality of power inlet receptors is available to be used to provide power to the plurality of power outlets. A cable between the switches connects the of switches so that when one switch from is in the unlock position, the cable is taunt preventing any of the other switches from moving to the unlock position.

Figure 1:
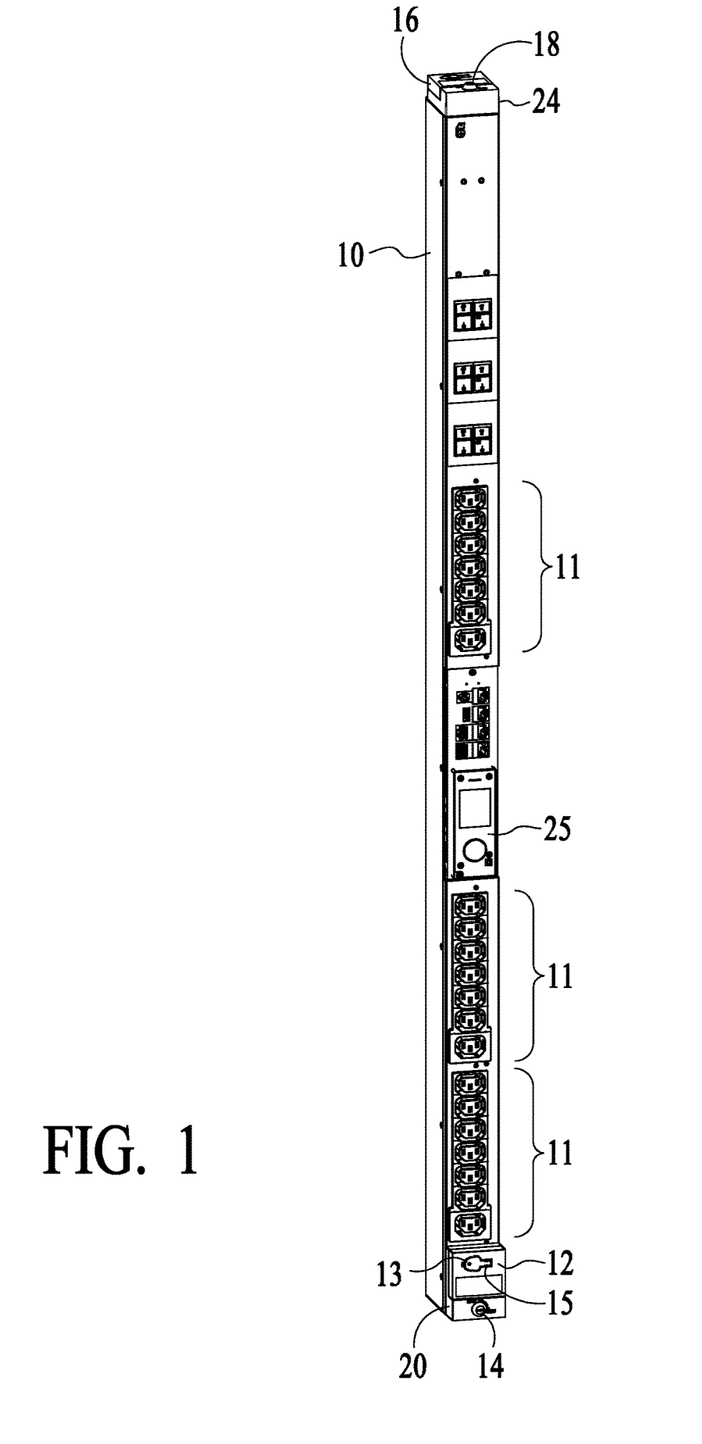
FIG. 1 and FIG. 2 show different views of a power distributor with multiple locations for receiving power.

FIG. 1 shows a power distributor 10 that includes power outlets 11. Power outlets 11 serve as electrical sockets. A detachable display 25 is attached to power distributor 10.

Power distributor 10 can receive power from one of two power inlet receptor locations. A first power inlet receptor location resides under a cover 12. A second power inlet receptor location resides under a cover 16.

For example, cover 12 is mounted on a cover mounting structure 20. A recessed area 15 is configured as a receptor to hold a key 13. Key 13 can be used to unlock a lock 14 to remove cover 12. Key 13 can also be used to unlock a lock 18 to remove a cover 16.

Figure 2:
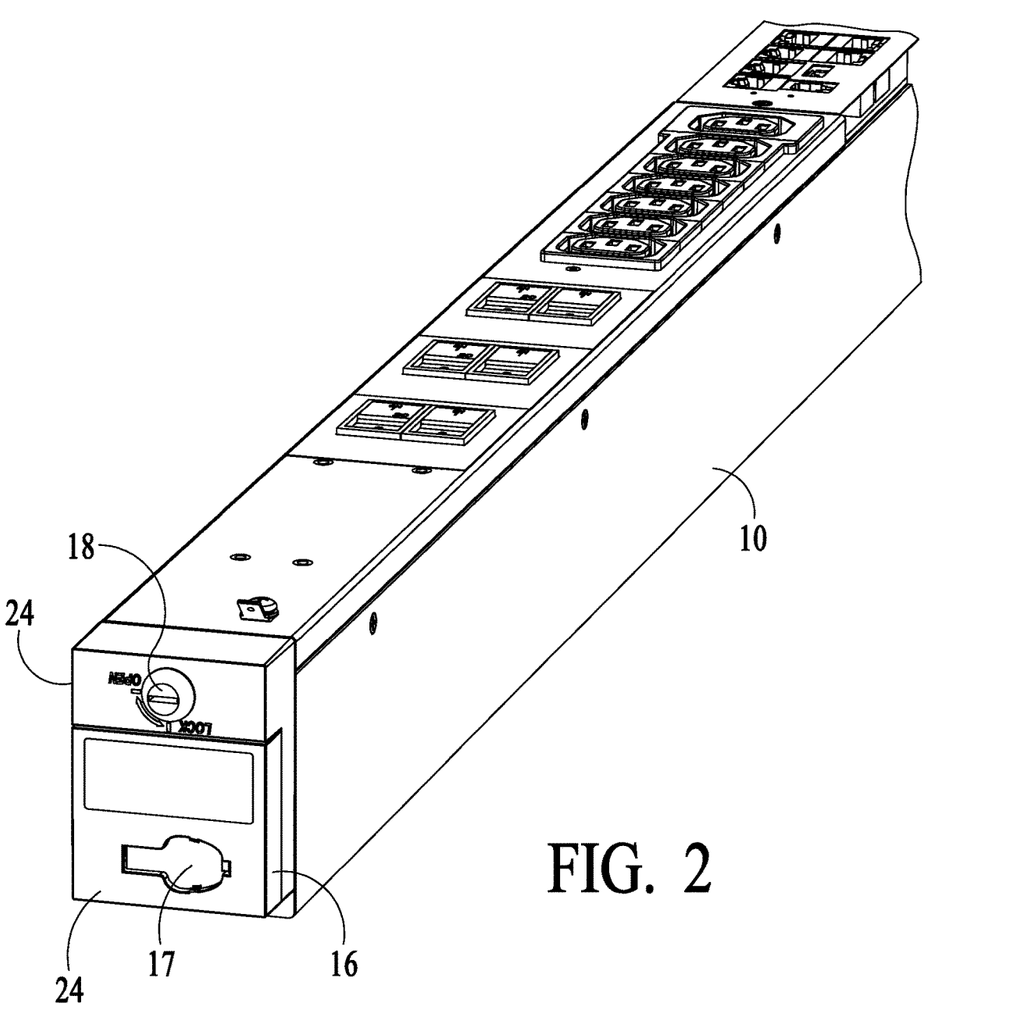

FIG. 2 shows that cover 16 includes recessed area 17 that is configured as a receptor to hold a key 13.

Figure 3:
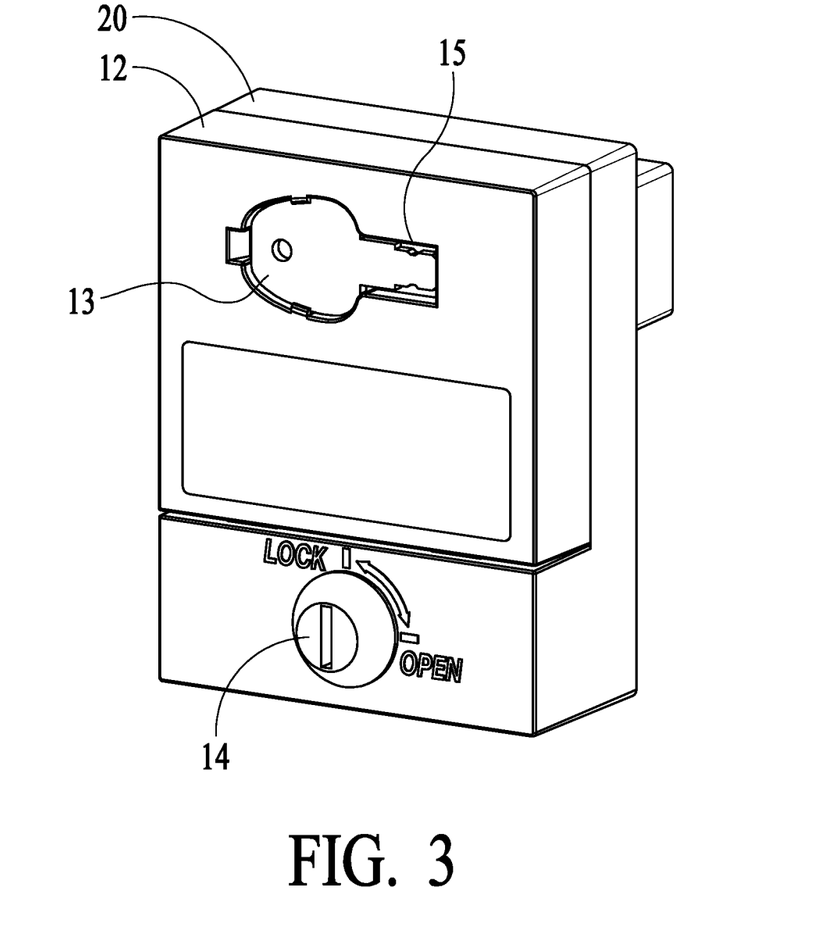
FIG. 3 and FIG. 4 show a protection mechanism that protects against simultaneously supplying power at multiple locations of the power distributor shown in FIG. 1 and FIG. 2.

FIG. 3 shows additional detail of cover 12, cover mounting structure 20 and lock 14 when cover 12 is mounted on cover mounting structure 20 and lock 14 is in the locked position.

Figure 4:
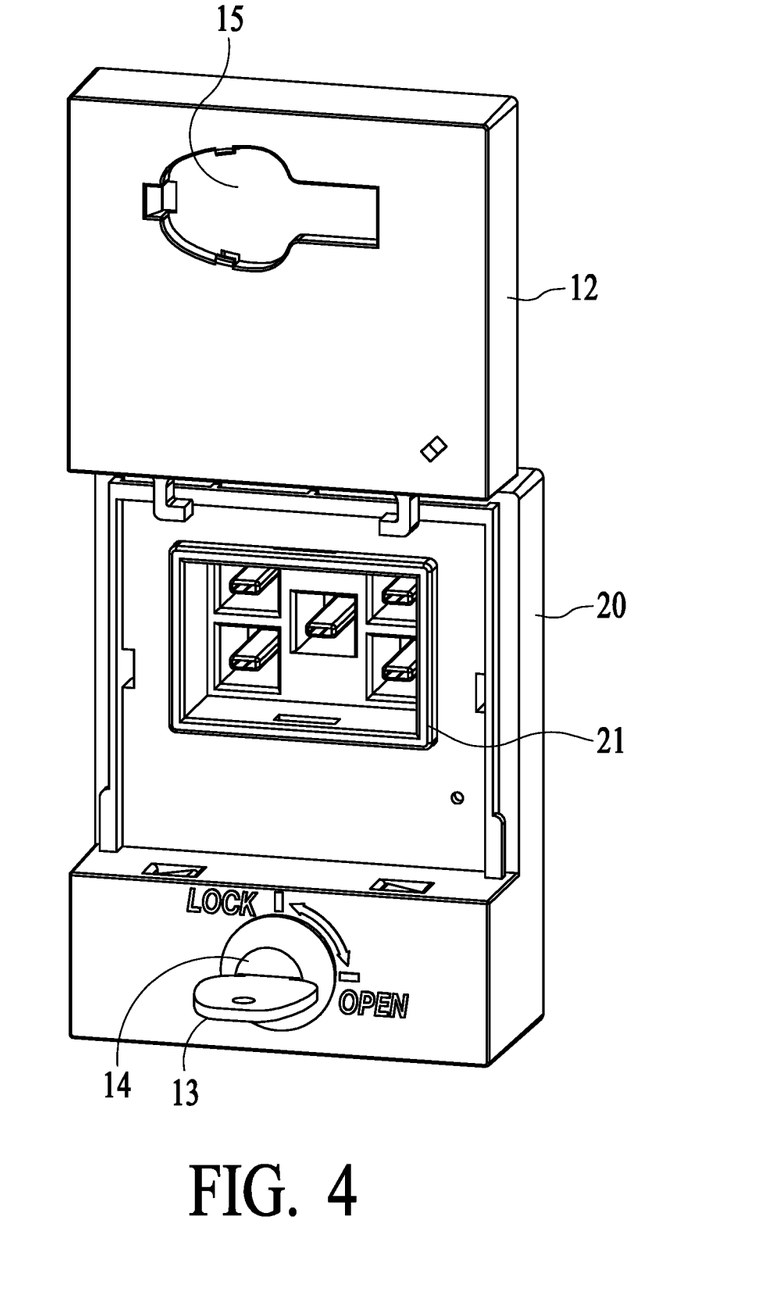

FIG. 4 shows cover 12, cover mounting structure 20 and lock 14 when key 13 is inserted into lock 14 and turned to the open position allowing cover 12 to be removed from mounting structure 20. Removing cover 12 from cover mounting structure 20 reveals a power inlet receptor 21 which can be used to supply power to all of power outlets 11 of power distributor 10. Lock 14 is configured so that key 13 cannot be removed from lock 14 while lock 14 is in the open position and so that lock 14 will not be free to be returned to the lock position until cover 12 is replaced on structure 20. So, to remove key 13 from lock 14 it is required that first cover be replaced onto structure 20 and then key 13 can be rotated to the lock position and key 13 removed from lock 14. Alternatively, lock 14 can be unlocked while cover 12 is removed from mounting structure 20.

Lock 18 works in the same manner as lock 14. That is, when key 13 is inserted into lock 18 and turned to the open position, this allows cover 16 to be removed from cover mounting structure. Removing cover 16 from cover mounting structure 24 reveals a power inlet receptor which can be used to supply power to all of power outlets 11 of power distributor 10. Lock 18 is configured so that key 13 cannot be removed from lock 18 while lock 18 is in the open position and so that lock 18 will not be free to be returned to the lock position until cover 16 is replaced on cover mounting structure 24. So, to remove key 13 from lock 18 it is required that first cover 16 be replaced onto cover mounting structure 24 and then key 13 can be rotated to the lock position and key 13 removed from lock 18. Alternatively, lock 18 can be unlocked while cover 16 is removed from mounting structure 24.

Only one key is supplied with power distributor 10. This assures that at most only one power inlet receptor is available at any one time. That is, both cover 12 and cover 16 can be mounted and locked respectively on cover mounting structure 21 and cover mounting structure 24 preventing access to any power inlet receptor. Power inlet cover 12 can be removed while cover 16 remains mounted on cover mounting structure 24 allowing only one power inlet receptor to be accessed or power inlet cover 16 can be removed while cover 12 remains mounted on cover mounting structure 20 also allowing only one power inlet receptor to be accessed. However, the existence of only one key prevents power inlet cover 12 and cover 16 being simultaneously removed.

The use of cover 12 and cover 16 as described above is a safety feature that prevents more than one power inlet receptor to be used at the same time.

While this system is described above with power inlet receptors located at two locations, the system works regardless of the number of power inlet receptors contained on a power distributor. Each power inlet receptor is covered and locked by a cover similar cover 12 and cover 14 and a lock similar to lock 14 and lock 18. Only one key is supplied so that regardless of the number of covers, only one cover can be open at any one time so that at most only one power inlet receptor is available for connection.

Figure 5:
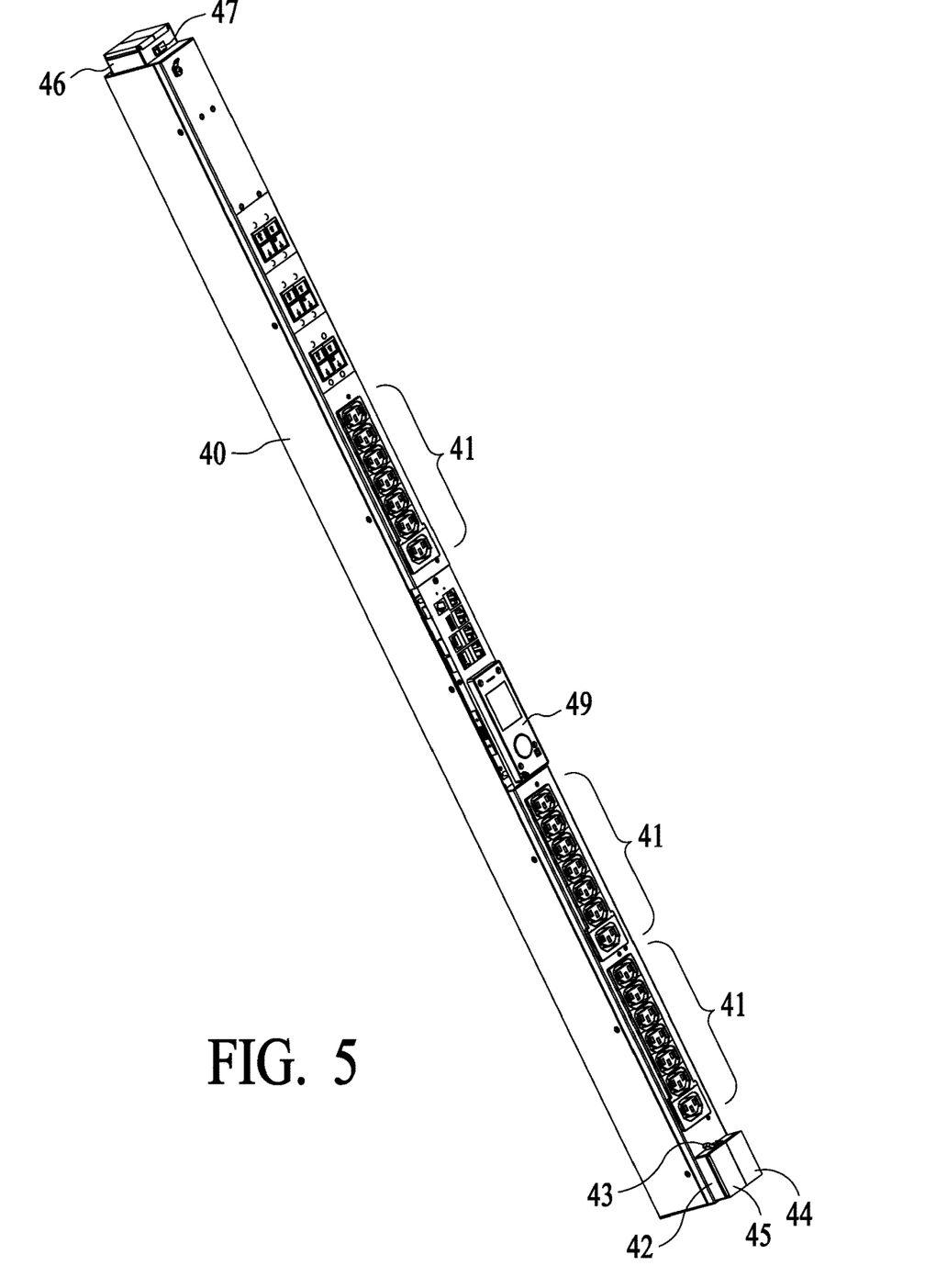
FIG. 5 shows another power distributor with multiple locations for receiving power.

FIG. 5 shows a power distributor 40 that includes power outlets 41. Power outlets 41 serve as electrical sockets. A detachable display 49 is attached to power distributor 40.

Power distributor 40 can receive power from one of two power inlet receptor locations. A first power inlet receptor location resides under a door 44 and a door 45 of a cover 42. A second power inlet receptor location resides under doors of a cover 46. Cover 46 works in an identical manner as cover 42.

Figure 6:
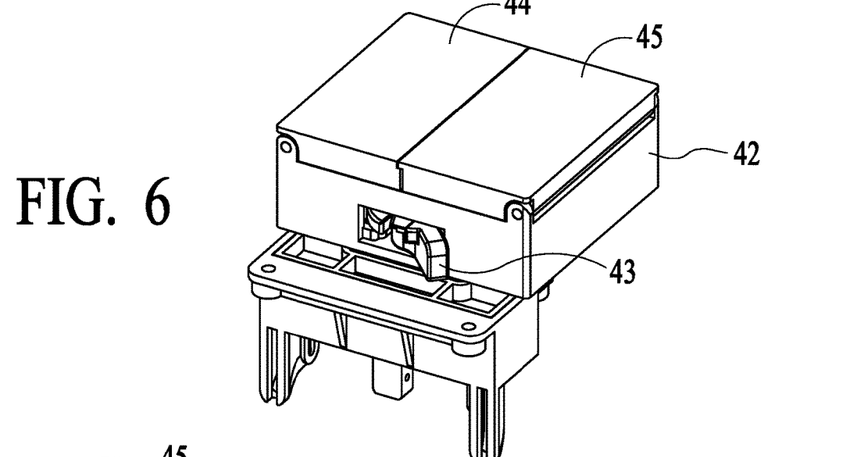
FIG. 6, FIG. 7 and FIG. 8 show a protection mechanism that protects against simultaneously supplying power at multiple locations of the power distributor shown in FIG. 5.

As illustrated by FIG. 6, when a switch 43 is in a lock position, door 44 and door 45 of cover 42 remain in a closed and locked position. Likewise, when a switch 47 is in a lock position, doors of cover 46 remain in a closed and locked position.

Figure 7:
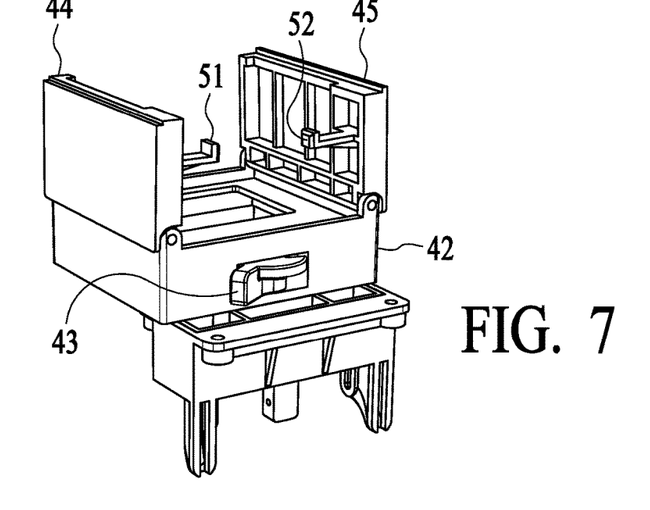
Figure 8:
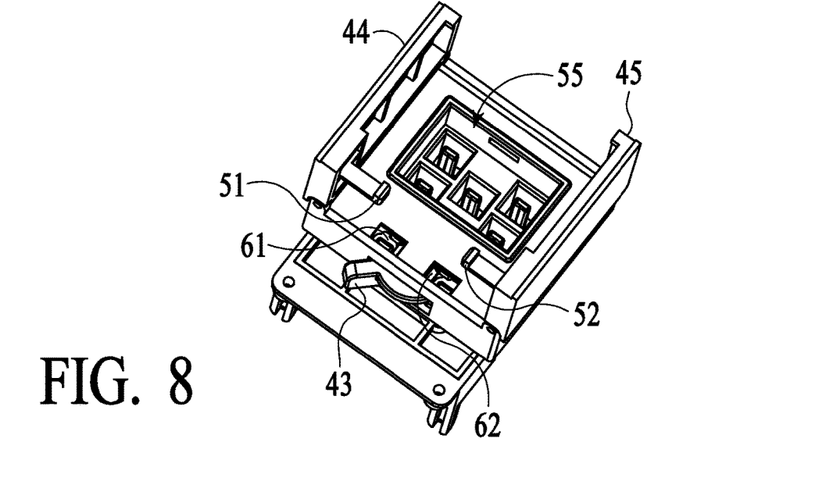

As illustrated by FIG. 7 and FIG. 8, when switch 43 is in an unlock position, door 44 and door 45 of cover 42 can be opened to allow access to a power inlet receptor 55. A latch stem 51 on door 44 is used to lock door 44 shut and a latch stem 52 on door 45 is used to lock door 45 shut. Likewise, when switch 47 is in an unlock position, the doors of cover 46 can be opened to allow access to a power inlet receptor. Latch stems on the doors of cover 46 are used to lock the doors shut.

To lock door 44 and door 45, door 44 is shut placing latch step 51 through an opening 61 and door 45 is shut placing latch stem 52 through an opening 62. Then switch 43 is rotated to the lock position.

Figure 9:
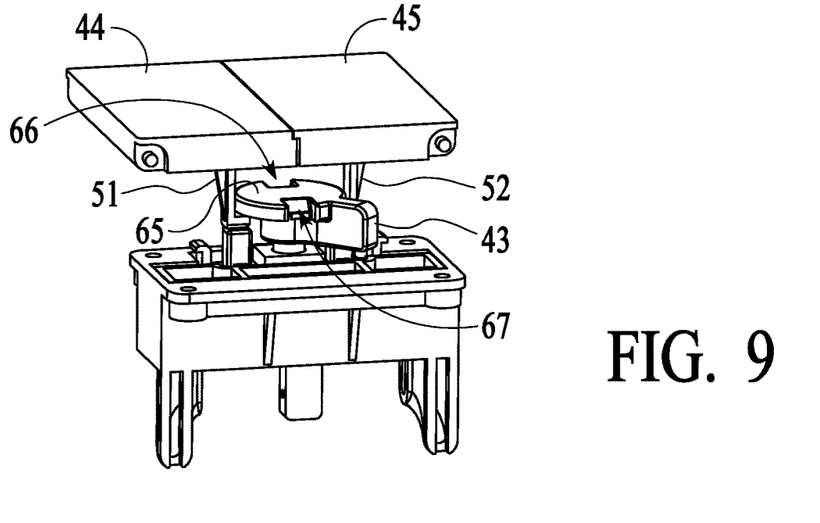
FIG. 9 and FIG. 10 show partially disassembled views illustrating operation of the protection mechanism shown in FIG. 6, FIG. 7 and FIG. 8.

As illustrated by the partial disassembled view in FIG. 9, when lock switch 43 is rotated into the lock position, a ridge 65 of switch 43 engages latch stem 51 and latch stem 52, locking door 44 and door 45. When lock switch 43 is in the open position, a gap 67 in ridge 65 aligns with opening 61, releasing latch stem 51 and allowing door 44 to open. Likewise, when lock switch 43 is in the open position, a gap 66 in ridge 65 aligns with opening 62, releasing latch stem 52 and allowing door 45 to open.

Figure 10:
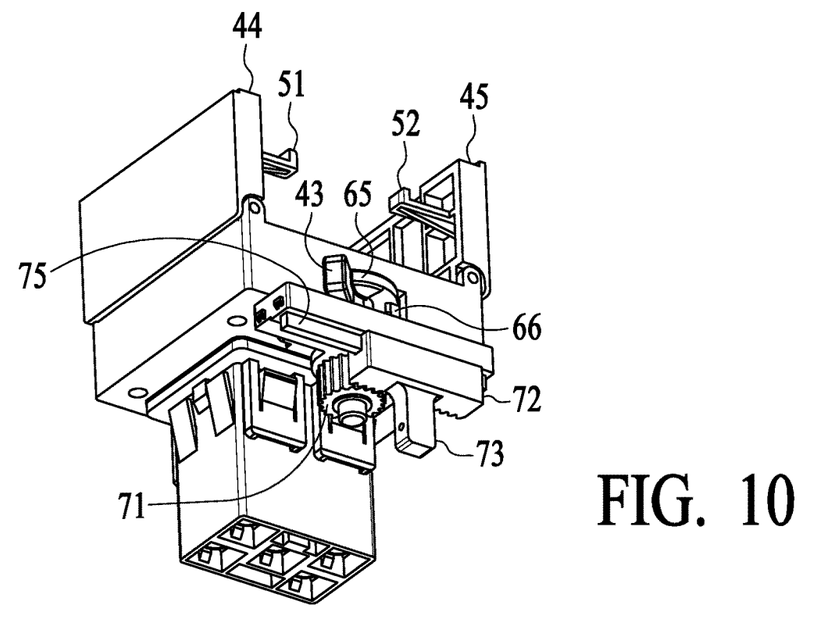

As illustrated by the partial disassembled view in FIG. 10, a gear 71 is attached to switch 43, so that gear 71 rotates in synchronization with switch 43. Teeth of engage with teeth of a sliding section 72 which slides along a track 75. Sliding section 72 includes a post 73.

Figure 11:
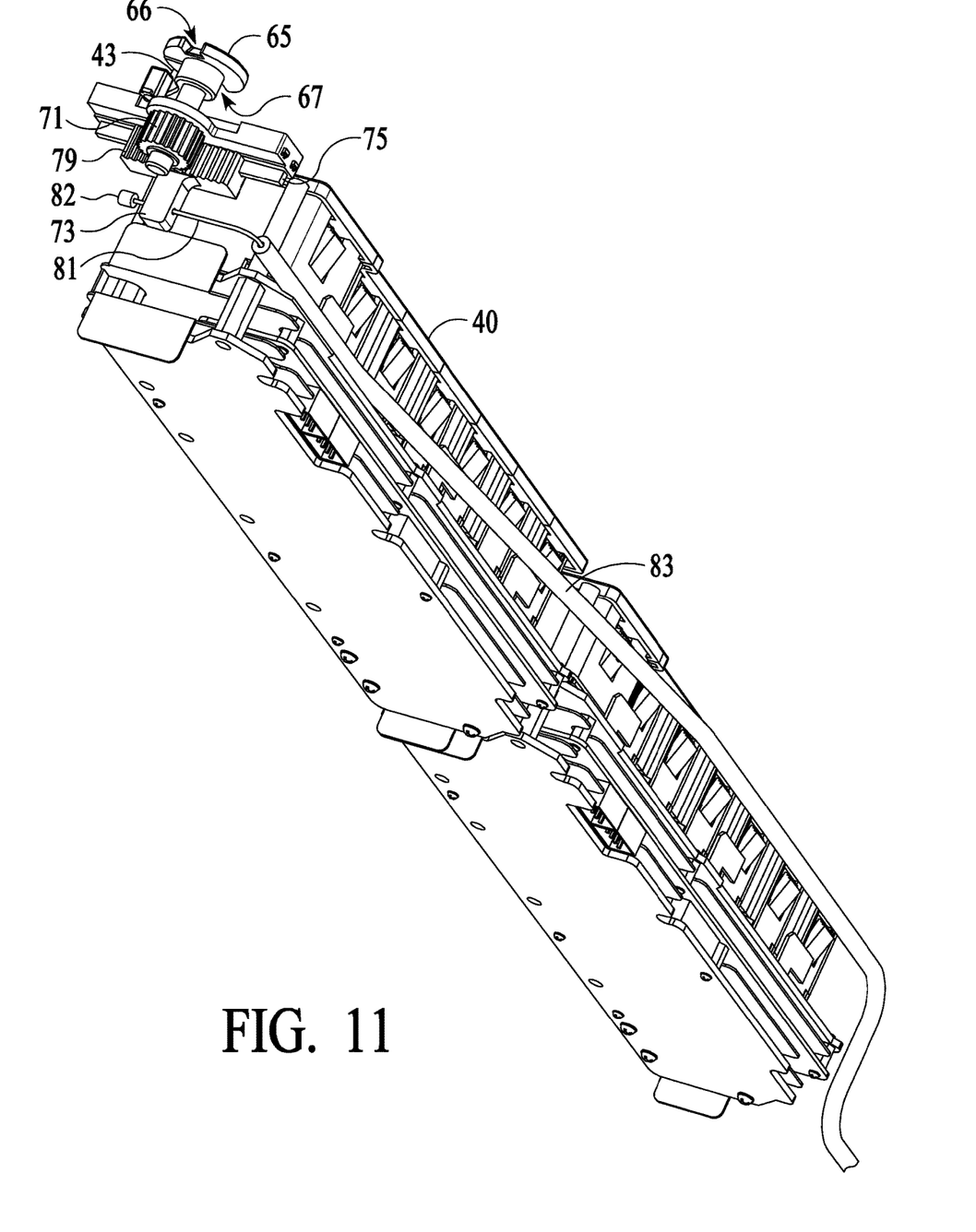
FIG. 11, FIG. 12 and FIG. 13 show partially disassembled views of the power distributor shown in FIG. 5 to illustrate coordination of the operation of multiple protection mechanisms.
Figure 12:
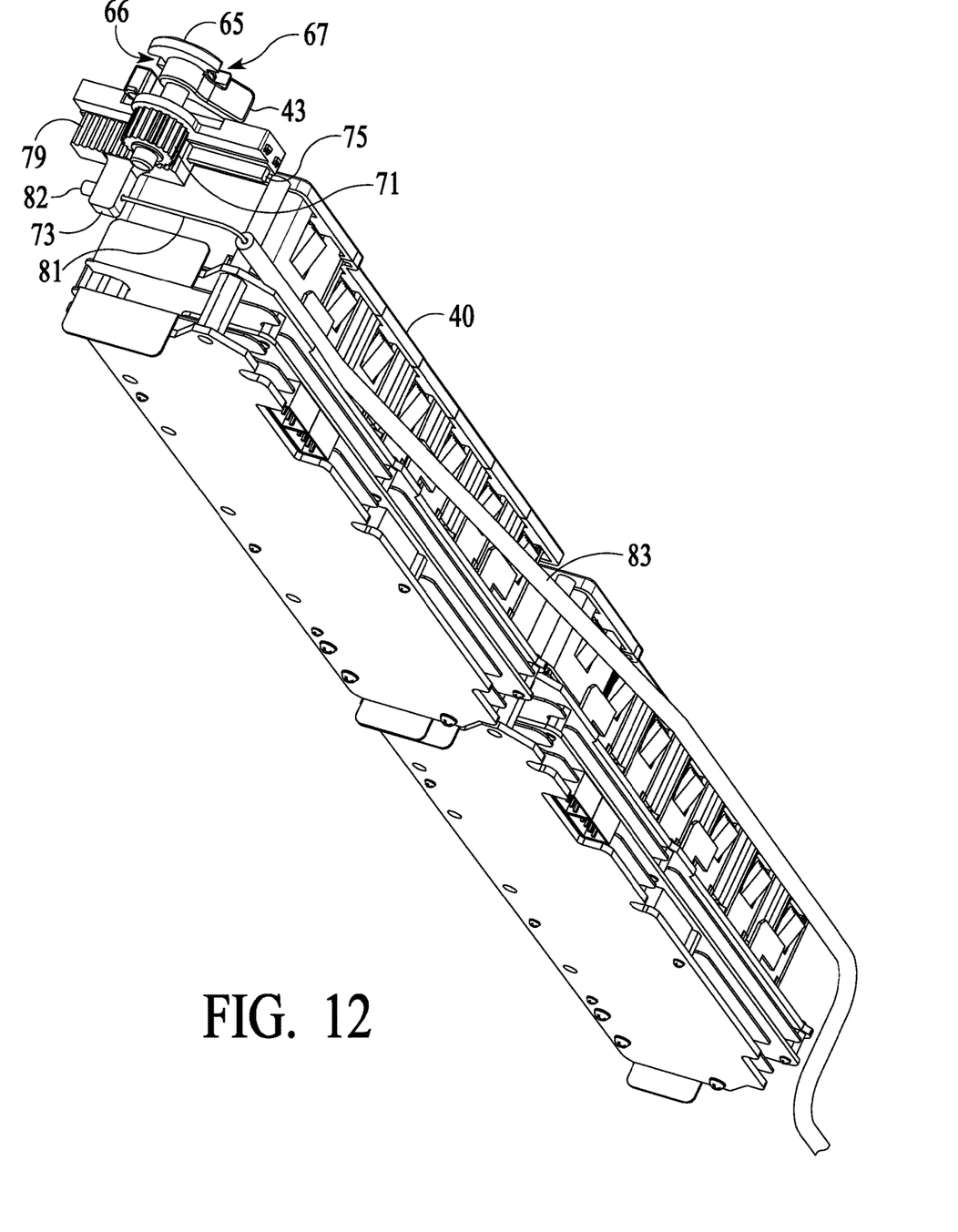
Figure 13:
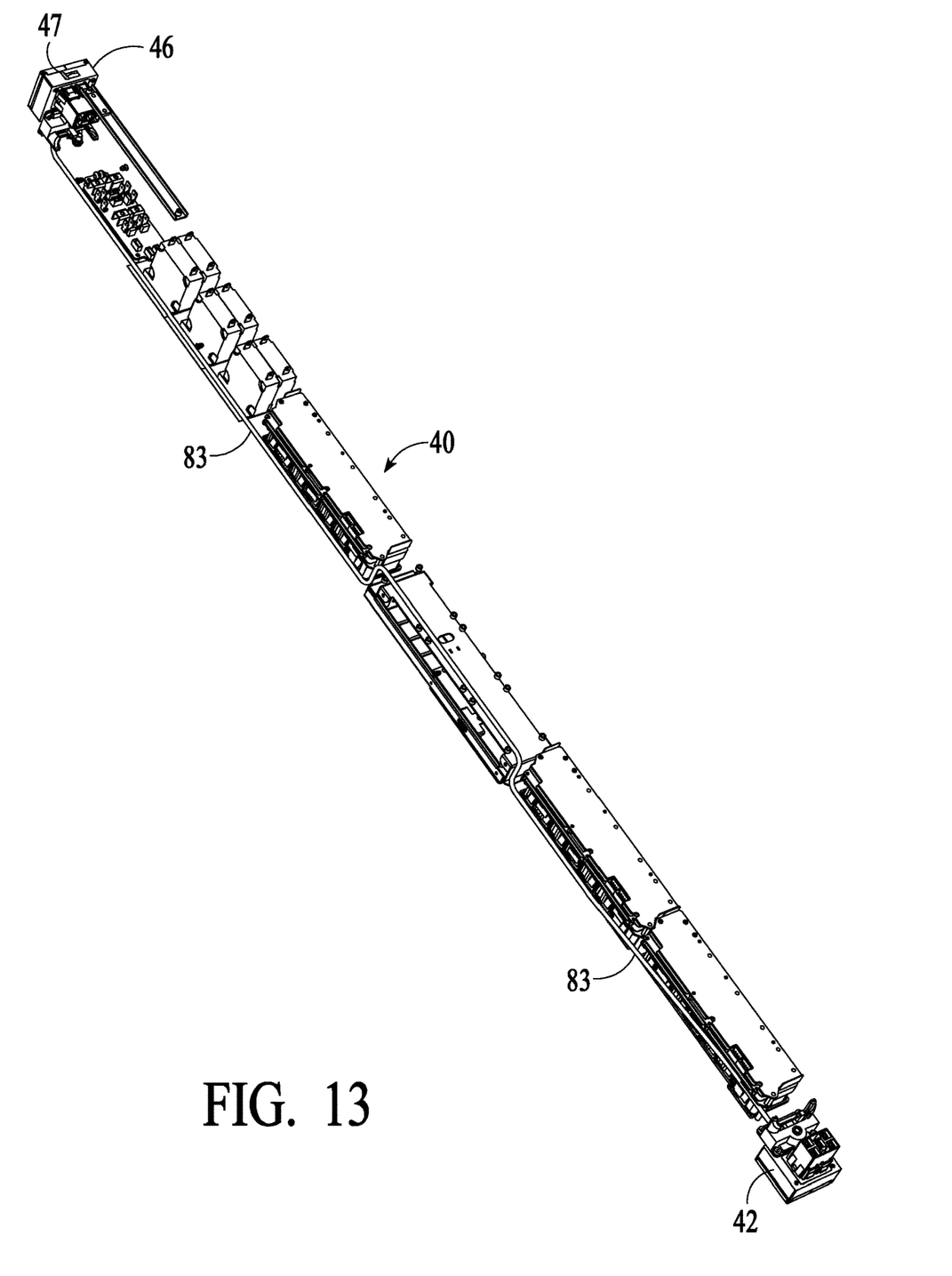

As illustrated by the partial disassembled views of power distributor 40 in FIG. 11 and FIG. 12, a cable 81 with a stopper 82 is attached through post 73. As illustrated by FIG. 13, cable 81 within housing 83 traverses the length of power distributor 40 with one end connected through post 73 of cover 42 and the other end connected through an identical pose of cover 46.

As illustrated by FIG. 11, when switch 43 is in locked position and switch 47 is in a locked position, there is enough slack in cable 81 so that either switch 43 can moved to the open position. However, when switch 43 is rotated into the open position this removes the slack in cable 81 so that switch 47 is prevented from being rotated to the open position. Likewise, when switch 43 and switch 47 are both in the locked position allowing switch 47 to be rotated to the open position, once switch 47 is rotated into the open position, this removes the slack in cable 81 so that switch 43 is prevented from being rotated to the open position. Therefore, at most only one of switch 43 and switch 47 can be in the open position at the same time. The use of cover 42 and cover 46 as described above is a safety feature that prevents more than one power inlet receptor to be available for use at the same time.

The foregoing discussion discloses and describes merely exemplary methods and embodiments. As will be understood by those familiar with the art, the disclosed subject matter may be embodied in other specific forms without departing from the spirit or characteristics thereof. Accordingly, the present disclosure is intended to be illustrative, but not limiting, of the scope of the invention, which is set forth in the following claims.

What is claimed is:

1. A power distributor comprising:
   a plurality of power outlets;
   a first power inlet receptor being configured to supply power to all the power outlets in the plurality of power outlets;
   a second power inlet receptor being configured to supply power to all the power outlets in the plurality of power outlets;
   a first cover for the first power inlet receptor, wherein the first cover prevents physical access to the first power inlet receptor when the first cover is in a closed and locked configuration;
   a second cover for the second power inlet receptor, wherein the second cover prevents physical access to the second power inlet receptor when the second cover is in a closed and locked configuration;
   a physical locking mechanism that is configured to lock the first cover and the second cover, the physical locking mechanism allowing at most one cover from the first cover and the second cover to be unlocked at a time so that the physical locking mechanism prevents the simultaneous unlocking of the first cover and the second cover, the physical locking mechanism comprising:
      a single key,
      a first lock on the first cover, the first lock configured so that the single key can be used to unlock the first lock to allow the first cover to be unlocked and placed in an open position so that first power inlet receptor is available to be used to provide power to the plurality of power outlets, wherein the first lock holds the single key and does not release the single key for removal until the first lock is locked, and
      a second lock on the second cover, the second lock configured so that the single key can be used to unlock the second lock to allow the second cover to be unlocked and placed in an open position so that second power inlet receptor is available to be used to provide power to the plurality of power outlets, wherein the second lock holds the single key and does not release the single key for removal until the second lock is locked.

2. A power distributor as in claim 1 wherein:
the first cover has a key receptor for holding the single key; and
the second cover has a key receptor for holding the single key.

3. A power distributor comprising:
a plurality of power outlets;
a first power inlet receptor being configured to supply power to all the power outlets in the plurality of power outlets;
a second power inlet receptor being configured to supply power to all the power outlets in the plurality of power outlets;
a first cover for the first power inlet receptor, wherein the first cover prevents physical access to the first power inlet receptor when the first cover is in a closed and locked configuration;
a second cover for the second power inlet receptor, wherein the second cover prevents physical access to the second power inlet receptor when the second cover is in a closed and locked configuration; and
a physical locking mechanism that is configured to lock the first cover and the second cover, the physical locking mechanism allowing at most one cover from the first cover and the second cover to be unlocked at a time so that the physical locking mechanism prevents the simultaneous unlocking of the first cover and the second cover, the physical locking mechanism comprising:
  a first switch for the first cover, the first switch being configured so that the first switch can be placed in an unlock position to allow the first cover to be placed in an open position so that the first power inlet receptor is available to be used to provide power to the plurality of power outlets,
  a second switch for the second cover, the second switch being configured so that the second switch can be placed in an unlock position to allow the second cover to be placed in an open position so that the second power inlet receptor is available to be used to provide power to the plurality of power outlets, and
  a cable between the first switch and the second switch, wherein the cable connects the first switch to the second switch so that when the first switch is in the unlock position, the cable is taunt preventing the second switch from moving to the unlock position and so that when the second switch is in the unlock position, the cable is taunt preventing the first switch from moving to the unlock position.

4. A power distributor comprising:
a plurality of power outlets;
a plurality of power inlet receptors, each power inlet receptor being configured to supply power to all the power outlets in the plurality of power outlets;
a plurality of covers, one cover for each power inlet receptor in the plurality of power inlet receptors, wherein each cover from the plurality of covers when in a closed and locked configuration prevents physical access to one power inlet receptor from the plurality of power inlet receptors; and
a physical locking mechanism that is configured to lock every cover from the plurality of covers, the physical locking mechanism allowing at most one cover from the plurality of covers to be unlocked at a time so that the physical locking mechanism prevents the simultaneous unlocking of more than one cover from the plurality of covers.

5. A power distributor as in claim 4, wherein the physical locking mechanism comprises:
a single key; and
a plurality of locks, one lock for each cover in the plurality of covers, each lock in the plurality of locks being configured so that the single key can be used to unlock the lock to allow a cover from the plurality of covers to be unlocked and placed in an open position so that one power inlet receptor from the plurality of power inlet receptors is available to be used to provide power to the plurality of power outlets, wherein the lock holds the single key and does not release the single key for removal until the lock is locked, so that the single key cannot be used to simultaneously unlock more than one lock from the plurality of locks.

6. A power distributor as in claim 5 wherein each cover from the plurality of covers has a key receptor for holding the single key.

7. A power distributor as in claim 4, wherein the physical locking mechanism comprises:
a plurality of switches, one switch for each cover in the plurality of covers, each switch in the plurality of switches being configured so that the switch can be placed in an unlock position to allow a cover from the plurality of covers to be placed in an open position so that one power inlet receptor from the plurality of power inlet receptors is available to be used to provide power to the plurality of power outlets; and
a cable between the switches, wherein a cable connects the plurality of switches so that when one switch from the plurality of switches is in the unlock position, the cable is taunt preventing other switches in the plurality of switches from moving to the unlock position.

* * * * *